US009520103B2

(12) United States Patent
Chen

(10) Patent No.: US 9,520,103 B2
(45) Date of Patent: Dec. 13, 2016

(54) RGB-TO-RGBW COLOR CONVERTING SYSTEM AND METHOD

(71) Applicant: Shenzhen China Star Optoelectronics Technology Co., Ltd., Shenzhen, Guangdong (CN)

(72) Inventor: Lixuan Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 307 days.

(21) Appl. No.: 14/385,992

(22) PCT Filed: Jul. 25, 2014

(86) PCT No.: PCT/CN2014/082970
§ 371 (c)(1),
(2) Date: Sep. 17, 2014

(87) PCT Pub. No.: WO2016/008171
PCT Pub. Date: Jan. 21, 2016

(65) Prior Publication Data
US 2016/0267874 A1    Sep. 15, 2016

(30) Foreign Application Priority Data
Jul. 17, 2014  (CN) .......................... 2014 1 0342607

(51) Int. Cl.
*G09G 5/02*    (2006.01)
*G09G 3/20*    (2006.01)
(Continued)

(52) U.S. Cl.
CPC .............. *G09G 5/02* (2013.01); *G09G 3/2003* (2013.01); *G09G 3/3208* (2013.01);
(Continued)

(58) Field of Classification Search
CPC .............................. H01L 27/3213; G09G 5/02
See application file for complete search history.

(56) References Cited

U.S. PATENT DOCUMENTS 5,995,669 A * 11/1999 Shingu ................. G09G 3/3607
358/1.9
2007/0171218 A1* 7/2007 Hong ................... G09G 3/3406
345/211
(Continued)

*Primary Examiner* — Phi Hoang
(74) *Attorney, Agent, or Firm* — Andrew C. Cheng

(57) ABSTRACT

A RGB-to-RGBW color converting system includes: a linearization section for linearizing inputted RGB values; a comparing section for comparing the linearized RGB values to obtain maximum and minimum values; a binarization section for performing a brightness binarization on the linearized RGB values to obtain a brightness binarization value; a gain value determining section for comparing a percentage of number of pixels corresponding to the brightness binarization value to all number of pixels in an image with a preset percentage to obtain a gain value; an output value calculating section for calculating RGBW output values according to the linearized RGB values, the maximum value, the minimum value, the gain value and the preset percentage. Accordingly, the addition of W sub-pixel unit would not result in the decrease of RGB output values, so that the color saturation can be improved while the whole brightness of image is maintained.

12 Claims, 3 Drawing Sheets

(51) Int. Cl.
*G09G 3/32* (2016.01)
*H01L 27/32* (2006.01)
(52) U.S. Cl.
CPC . *H01L 27/3213* (2013.01); *G09G 2320/0626* (2013.01); *G09G 2320/0666* (2013.01); *G09G 2340/06* (2013.01)

(56) References Cited

U.S. PATENT DOCUMENTS

| | | | | |
|---|---|---|---|---|
| 2007/0279372 | A1* | 12/2007 | Brown Elliott | G09G 3/3426 345/102 |
| 2010/0259556 | A1* | 10/2010 | Inuzuka | G09G 3/3611 345/604 |
| 2013/0215360 | A1* | 8/2013 | Pollack | G09G 3/3413 349/61 |
| 2013/0222414 | A1* | 8/2013 | Ito | G09G 5/02 345/600 |
| 2014/0306983 | A1* | 10/2014 | Park | G06T 7/408 345/590 |

* cited by examiner

RGB-TO-RGBW COLOR CONVERTING SYSTEM AND METHOD

TECHNICAL FIELD

The present invention relates to the field of display technology, and particularly to a RGB-to-RGBW color converting system and a RGB-to-RGBW color converting method.

DESCRIPTION OF RELATED ART

Nowadays, in the display apparatuses having such as liquid crystal display (LCD) panels or organic light emitting diode (OLED) display panels, most of which use a red (R) sub-pixel unit, a green (G) sub-pixel unit and a blue (B) sub-pixel unit together to constitute one pixel unit. By controlling grayscale data of the sub-pixel units to mix a color wanted to be displayed by display panel and thereby displaying a color image. With the development of information technology, various requirements of display panel are increasing, and high transmittance, low power consumption and good image quality are becoming the demands of people to the display panel. The transmittance and mixing efficiency of the conventional RGB three primary color mixing display manner are relatively low, resulting in the power consumption of display panel is high, which restricts the product optimization of display panel. Accordingly, a display panel having a four-pixel unit constituted by a red (R) sub-pixel unit, a green (G) sub-pixel unit, a blue (B) sub-pixel unit and a fourth sub-pixel unit (e.g., white (W) sub-pixel unit) together has been proposed, so as to improve the display quality of RGB display panel.

However, in the RGBW display panel, since the addition of white (W) sub-pixel unit, output values of red, green and blue all are decreased, so that when the whole brightness of image is maintained, the color saturation would be degraded.

SUMMARY

In order to solve the problem in the prior art, an objective of the present invention is to provide a RGB-to-RGBW color converting system. The RGB-to-RGBW color converting system includes: a linearization section for linearizing inputted RGB values; a comparing section for comparing the linearized inputted RGB values to thereby obtain a maximum value and a minimum value; a binarization section for performing a brightness binarization on the linearized RGB values to thereby obtain a brightness binarization value; a gain value determining section for comparing a percentage of number of pixels corresponding to the brightness binarization value to all number of pixels in an image with a preset percentage to thereby obtain a gain value; and an output value calculating section for calculating out RGBW values according to the linearized RGB values, the maximum value, the minimum value, the gain value and the preset percentage.

In an exemplary embodiment, if the gain value determining section determines that the percentage of the number of pixels corresponding to the brightness binarization value to all the number of pixel in the image is greater than the preset percentage, the gain value determining section obtains the gain value using the following expression 1:

$$K=1/M,$$

Where K represents the gain value, and M represents the preset percentage.

In an exemplary embodiment, if the gain value determining section determines that the percentage of the number of pixels corresponding to the brightness binarization value to all the number of pixel in the image is not greater than the preset percentage, the gain value determining section obtains the gain value using the following expression 2:

$$K=M,$$

Where K represents the gain value, and M represents the preset percentage.

In an exemplary embodiment, the output value calculating section includes: a judging section for judging the minimum value whether is greater than 0 or equal to 0; a white output value calculating section for calculating out the W output value according to the judging result of the judging section and the gain value; a red output value calculating section for calculating out the R output value according to the linearized R value, the maximum value, the W output value and the preset percentage; a green output value calculating section for calculating out the G output value according to the linearized G value, the maximum value, the W output value and the preset percentage; and a blue output value calculating section for calculating out the B output value according to the linearized B value, the maximum value, the W output value and the preset percentage.

In an exemplary embodiment, if the judging section judges that the minimum value is greater than 0, the white output value calculating section calculates the W output value using the expression 3:

$$Wo=K\times[\mathrm{MIN}(Ri,Gi,Bi)]^2, \qquad [\text{Expression 3}]$$

the red output value calculating section calculates the R output value using the expression 5:

$$Ro=M\times Ri\times Wo/\mathrm{MAX}(Ri,Gi,Bi)+Ri-Wo, \qquad [\text{Expression 5}]$$

the green output value calculating section calculates the G output value using the expression 6:

$$Go=M\times Gi\times Wo/\mathrm{MAX}(Ri,Gi,Bi)+Gi-Wo, \qquad [\text{Expression 6}]$$

the blue output value calculating section calculates the B output value using the expression 7:

$$Bo=M\times Bi\times Wo/\mathrm{MAX}(Ri,Gi,Bi)+Bi-Wo, \qquad [\text{Expression 7}]$$

where Wo represents the W output value, Ro represents the R output value, Go represents the G output value, Bo represents the B output value, Ri represents the linearized R value, Gi represents the linearized G value, Bi represents the linearized B value, MAX (Ri, Gi, Bi) represents the maximum value, MIN (Ri, Gi, Bi) represents the minimum value, K represents the gain value, and M represents the preset percentage.

In an exemplary embodiment, if the judging section judges that the minimum value is equal to 0, the white output value calculating section calculates the W output value using the expression 4:

$$Wo=0, \qquad [\text{Expression 4}]$$

the red output value calculating section calculates the R output value using the expression 5:

$$Ro=M\times Ri\times Wo/\mathrm{MAX}(Ri,Gi,Bi)+Ri-Wo, \qquad [\text{Expression 5}]$$

the green output value calculating section calculates the G output value using the expression 6:

$$Go=M\times Gi\times Wo/\mathrm{MAX}(Ri,Gi,Bi)+Gi-Wo, \qquad [\text{Expression 6}]$$

the blue output value calculating section calculates the B output value using the expression 7:

$$Bo=M\times Bi\times Wo/\mathrm{MAX}(Ri,Gi,Bi)+Bi-Wo, \qquad [\text{Expression 7}]$$

where Wo represents the W output value, Ro represents the R output value, Go represents the G output value, Bo represents the B output value, Ri represents the linearized R value, Gi represents the linearized G value, Bi represents the linearized B value, MAX (Ri, Gi, Bi) represents the maximum value, MIN (Ri, Gi, Bi) represents the minimum value, K represents the gain value, and M represents the preset percentage.

Another objective of the present invention is to provide a RGB-to-RGBW color converting method. The RGB-to-RGBW color converting method includes: linearizing inputted RGB values; comparing the linearized RGB values to thereby obtain a maximum value and a minimum value; performing a brightness binarization on the linearized RGB values to thereby obtain a brightness binarization value; comparing a percentage of number of pixels corresponding to the brightness binarization value to all number of pixels in an image with a preset percentage to thereby obtain a gain value; and calculating RGBW values according to the linearized RGB values, the maximum value, the minimum value, the gain value and the preset percentage.

In an exemplary embodiment, if the percentage of the number of pixels corresponding to the brightness binarization value to all the number of pixel in the image is greater than the preset percentage, obtains the gain value using the following expression 1:

$$K=1/M,$$

Where K represents the gain value, and M represents the preset percentage.

In an exemplary embodiment, if the percentage of the number of pixels corresponding to the brightness binarization value to all the number of pixel in the image is not greater than the preset percentage, obtains the gain value using the following expression 2:

$$K=M,$$

Where K represents the gain value, and M represents the preset percentage.

In an exemplary embodiment, the step of calculating RGBW values includes: judging the minimum value whether is greater than 0 or equal to 0; and based on the judging result, using the gain value, the linearized RGB values, the maximum value, the W output value and the preset percentage to calculate the RGBW values.

In an exemplary embodiment, if the minimum value is greater than 0, calculates the RGBW values using expression 3, expression 5, expression 6 and expression 7:

$$Wo=K\times[\mathrm{MIN}(Ri,Gi,Bi)]^2, \quad \text{[Expression 3]}$$

$$Ro=M\times Ri\times Wo/\mathrm{MAX}(Ri,Gi,Bi)+Ri-Wo, \quad \text{[Expression 5]}$$

$$Go=M\times Gi\times Wo/\mathrm{MAX}(Ri,Gi,Bi)+Gi-Wo, \quad \text{[Expression 6]}$$

$$Bo=M\times Bi\times Wo/\mathrm{MAX}(Ri,Gi,Bi)+Bi-Wo, \quad \text{[Expression 7]}$$

where Wo represents the W output value, Ro represents the R output value, Go represents the G output value, Bo represents the B output value, Ri represents the linearized R value, Gi represents the linearized G value, Bi represents the linearized B value, MAX (Ri, Gi, Bi) represents the maximum value, MIN (Ri, Gi, Bi) represents the minimum value, K represents the gain value, and M represents the preset percentage.

In an exemplary embodiment, if the minimum value is equal to 0, calculates the W output value using expression 4, expression 5, expression 6 and expression 7:

$$Wo=0, \quad \text{[Expression 4]}$$

$$Ro=M\times Ri\times Wo/\mathrm{MAX}(Ri,Gi,Bi)+Ri-Wo, \quad \text{[Expression 5]}$$

$$Go=M\times Gi\times Wo/\mathrm{MAX}(Ri,Gi,Bi)+Gi-Wo, \quad \text{[Expression 6]}$$

$$Bo=M\times Bi\times Wo/\mathrm{MAX}(Ri,Gi,Bi)+Bi-Wo, \quad \text{[Expression 7]}$$

where Wo represents the W output value, Ro represents the R output value, Go represents the G output value, Bo represents the B output value, Ri represents the linearized R value, Gi represents the linearized G value, Bi represents the linearized B value, MAX (Ri, Gi, Bi) represents the maximum value, MIN (Ri, Gi, Bi) represents the minimum value, K represents the gain value, and M represents the preset percentage.

Accordingly, the present invention would not result in the decrease of R output value, G output value and B output value while W sub-pixel unit is added, so that the color saturation can be improved while the whole brightness of image is maintained.

BRIEF DESCRIPTION OF THE DRAWINGS

The above embodiments will become more readily apparent to those ordinarily skilled in the art after reviewing the following detailed description and accompanying drawings.

DETAILED DESCRIPTION OF EMBODIMENTS

In the following, various embodiments of the present invention will be described in detail with reference to accompanying drawings. The present invention may be embodied in many different forms and should not be construed as limited to the embodiments set forth herein. Rather, these embodiments are provided to explain the principles of the present invention and its practical applications, so that other skilled in the art can understand various embodiments of the present invention and various modifications suitable for specific intended applications.

The display apparatus in the exemplary embodiment may be for example a liquid crystal display (LCD) apparatus, an organic light emitting diode (OLED) display apparatus, and so on.

Figure 1:
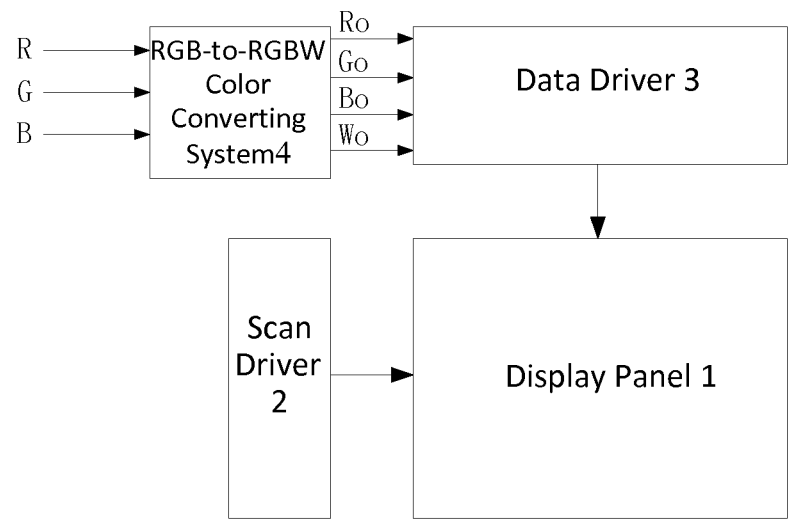
FIG. 1 is a schematic block diagram of a display apparatus according to an exemplary embodiment of the present invention.
Figure 2:
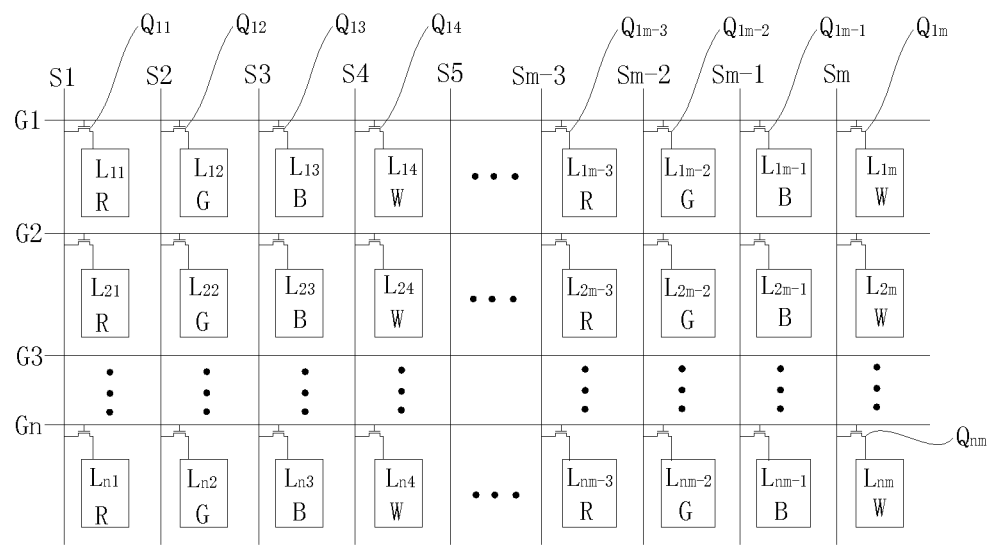
FIG. 2 is a schematic structural diagram of a display panel according to an exemplary embodiment of the present invention.

FIG. 1 is a schematic block diagram of a display apparatus according to an exemplary embodiment of the present invention. FIG. 2 is a schematic structural diagram of a display panel according to an exemplary embodiment of the present invention.

Referring to FIGS. 1 and 2, the display apparatus according to the exemplary embodiment of the present invention includes a display panel 1, a scan driver 2, a data driver 3 and a RGB-to-RGBW color converting system 4.

The display panel 1 includes scan lines G1 to Gm (m is a natural number) extending along row direction, and data lines S1 to Sn (n is a natural number) extending along column direction. The scan lines G1 to Gm are connected to the scan driver 2. The data lines S1 to Sn are connected to the data driver 3.

Each sub-pixel Lij, i.e., a red (R) sub-pixel, a green (G) sub-pixel, a blue (B) sub-pixel or a white (W) sub-pixel, is arranged in a region defined by the scan lines Gi, Gi+1 (i is from 1 to m) and the data lines Sj, Sj+1 (j is from 1 to n). In the illustrated embodiment, one red sub-pixel, one green sub-pixel, one blue sub-pixel and one white sub-pixel together constitute one pixel.

Each thin film transistor (TFT) Qij is arranged near an intersection of the scan line Gi and the data line Sj.

Moreover, the scan line Gi is connected to a gate of the thin film transistor Qij, the data line Sj is connected to a source of the thin film transistor Qij, and a pixel electrode of the sub-pixel Lij (i.e., a red (R) sub-pixel, a green (G) sub-pixel, a blue (B) sub-pixel or a white (W) sub-pixel) is connected to a drain of the thin film transistor Qij.

A common electrode arranged opposite to the pixel electrode of the sub-pixel Lij is connected to a common voltage circuit (not shown).

The scan driver 2 and the data driver 3 are arranged in a peripheral region of the display panel 1. The RGB-to-RGBW color converting system 4 converts inputted RGB values into output RGBW values (i.e., RGBW output values) and then provides the RGBW output values to the data driver 3 for image display. Herein, the inputted RGB values may be provided from for example an external host computer or graphic controller (not shown).

The data driver 3 receives and processes the RGBW output values from the RGB-to-RGBW color converting system 4 to generate analog-type data signals and then provide the analog-type data signals onto the data lines S1 to Sn. The scan driver 2 sequentially provides multiple scan signals onto the scan lines G1 to Gm. As a result, an image display on the display panel 1 can be achieved.

Figure 3:
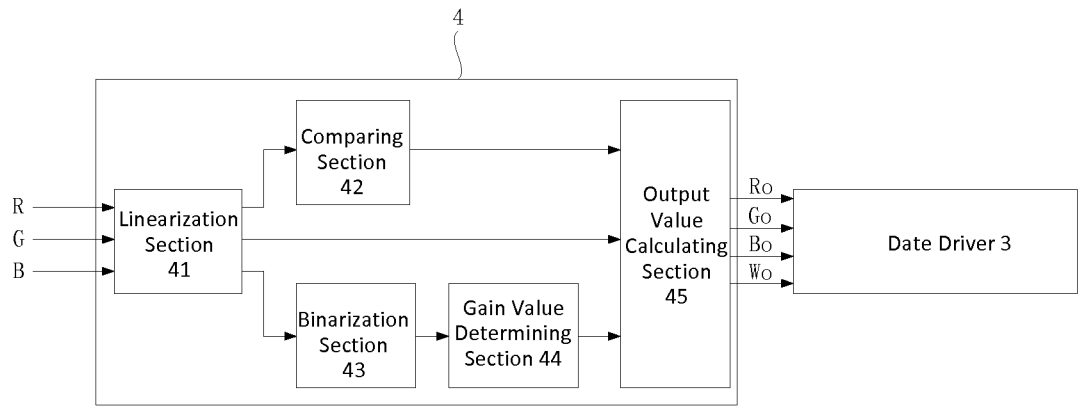
FIG. 3 is a principal block diagram of a RGB-to-RGBW color converting system according to an exemplary embodiment of the present invention.

FIG. 3 is a principal block diagram of the RGB-to-RGBW color converting system according to an exemplary embodiment of the present invention.

Referring to FIG. 3, the RGB-to-RGBW color converting system 4 in the exemplary embodiment of the present invention includes a linearization section 41, a comparing section 42, a binarization section 43, a gain value determining section 44 and an output value calculating section 45. For example, in an exemplary embodiment, the RGB-to-RGBW color converting system 4 includes one or more processors and a memory storing software modules executed by the one or more processors including the linearization section 41, the comparing section 42, the binarization section 43, the gain value determining section 44 and the output value calculating section 45.

The linearization section 41 linearizes the inputted RGB values. In particular, the linearization section 41 linearizes the inputted RGB values before the comparing section 42 determines a maximum value and a minimum value of the RGB values. The linearization of the inputted RGB values can be expressed as a process of converting the inputted RGB values into values linearly proportional to an output brightness. The linearization section 41 then provides the linearized RGB values to the comparing section 42, the binarization section 43 and the output value calculating section 45.

The comparing section 42 receives the linearized RGB values provided by the linearization section 41 and compares the received linearized RGB values to determine the maximum value and the minimum value. The maximum value is a maximum value of the linearized RGB values and expressed as MAX (Ri, Gi, Bi). Where Ri represents the linearized R value, Gi represents the linearized G value and Bi represents the linearized B value. The minimum value is a minimum value of the linearized RGB values and expressed as MIN (Ri, Gi, Bi). The comparing section 42 then provides the maximum value MAX (Ri, Gi, Bi) and the minimum value MIN (Ri, Gi, Bi) to the output value calculating section 45.

The binarization section 43 receives the linearized RGB values provided by the linearization section 41 and performs a brightness binarization processing on the received linearized RGB values to thereby obtain a brightness binarization value Li. The binarization section 43 performs the brightness binarization processing on the received linearized RGB values according to the following expression 1.

$$Li = 0.299 \times Ri + 0.587 \times Gi + 0.114 \times Bi \quad \text{[Expression 1]}$$

The binarization section 43 then provides the obtained brightness binarization value Li to the gain value determining section 44.

The gain value determining section 44 receives the brightness binarization value Li provided by the binarization section 43, determines a percentage of number of pixels corresponding to the brightness binarization value Li in a brightness histogram according to the received brightness binarization value Li, compares the percentage of the determined number of pixels corresponding to the brightness binarization value Li to all number of pixels in an image with a built-in preset percentage M, and thereby determines a gain value K. Herein, if the gain value determining section 44 determines that the percentage of the number of pixels corresponding to the brightness binarization value Li to the all number of pixels in the image is greater than the preset percentage M, the gain value determining section 44 determines the gain value K=1/M. If the gain value determining section 44 determines that the percentage of the number of pixels corresponding to the brightness binarization value Li to the all number of pixels in the image is not greater than the preset percentage M, the gain value determining section 44 determines the gain value K=M. The gain value determining section 44 then provides the determined gain value K and the built-in preset percentage M to the output value calculating section 45.

The output value calculating section 45 receives the linearized RGB values provided by the linearization section 41, the maximum value MAX (Ri, Gi, Bi) and the minimum value MIN (Ri, Gi, Bi) determined by the comparing section 42, the gain value K determined by the gain value determining section 44 and the preset percentage M provided by the gain value determining section 44, and calculates out desired RGBW output values according to the received linearized RGB values provided by the linearization section 41, the maximum value MAX (Ri, Gi, Bi) and minimum value MIN (Ri, Gi, Bi) determined by the comparing section 42, the gain value K determined by the gain value determining section 44 and the preset percentage M provided by the gain value determining section 44. The desired RGBW output values include red (R) output value, green (G) output value, blue (B) output value and white (W) output value.

In the following, the output value calculating section 45 according to an exemplary embodiment of the present invention will be described in detail.

Figure 4:
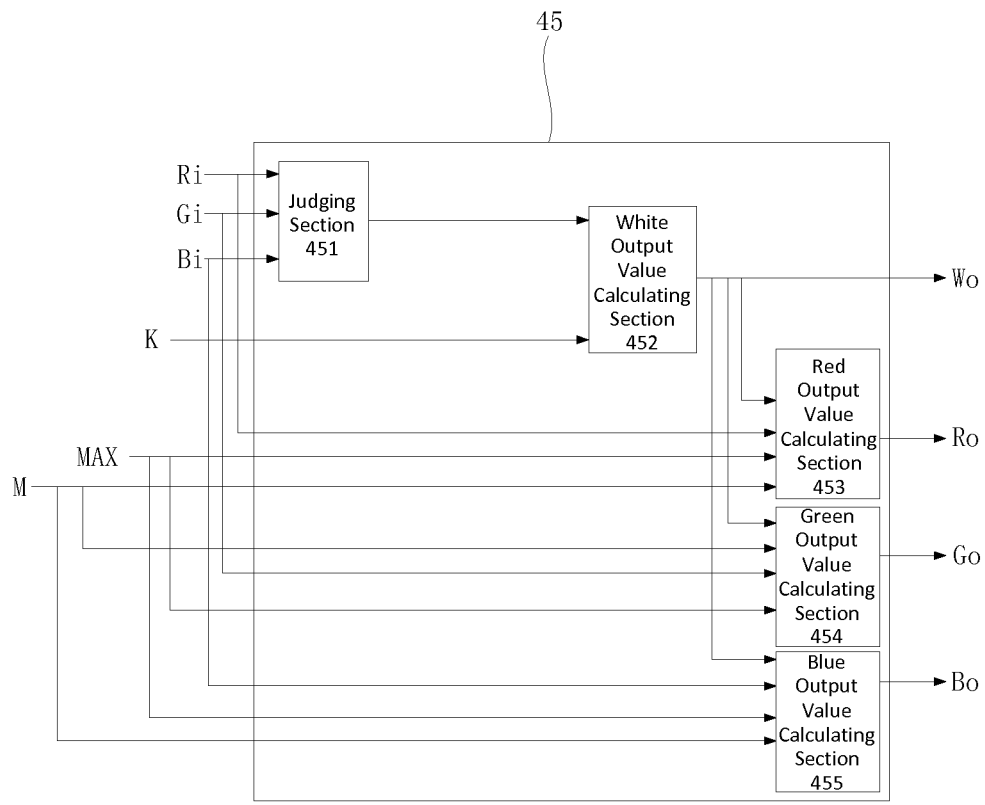
FIG. 4 is a principal block diagram of an output value calculating section according to an exemplary embodiment of the present invention.

FIG. 4 is a principal block diagram of the output value calculating section according to an exemplary embodiment of the present invention.

Referring to FIG. 4, the output value calculating section 45 includes a judging section 451, a white output value calculating section 452, a red output value calculating section 453, a green output value calculating section 454 and a blue output value calculating section 455.

The judging section 451 receives the minimum value MIN (Ri, Gi, Bi) determined by the comparing section 42, and judges the received minimum value MIN (Ri, Gi, Bi) whether is greater than 0 or equal to 0. The judging section 451 provides the judge result to the white output value calculating section 452, the red output value calculating section 453, the green output value calculating section 454 and the blue output value calculating section 455.

The white output value calculating section 452 receives the judge result provided by the judging section 451 and the gain value K determined by the gain value determining section 44, and calculates out the white output value (i.e., W output value) according to the received judge result and gain value K.

Herein, if the judging section 451 judges that the minimum value MIN (Ri, Gi, Bi) is greater than 0, the white output value calculating section 452 calculates the white output value according to the following expression 2.

$$Wo = K \times [MIN(Ri, Gi, Bi)]^2 \quad \text{[Expression 2]}$$

Where Wo represents the white output value.

If the judging section 451 judges that the minimum value MIN(Ri, Gi, Bi) is equal to 0, the white output value calculating section 452 calculates the white output value according to the following expression 3.

$$Wo = 0 \quad \text{[Expression 3]}$$

Where Wo represents the white output value.

The white output value calculating section 452 provides the calculated white output value to the red output value calculating section 453, the green output value calculating section 454 and the blue output value calculating section 455.

The red output value calculating section 453 receives the linearized R value provided by the linearization section 41, the maximum value MAX (Ri, Gi, Bi) determined by the comparing section 42, the white output value provided by the white output value calculating section 452 and the built-in preset percentage M provided by the gain value determining section 44, and calculates out the red (R) output value according to the received linearized R value provided by the linearization section 41, the maximum value MAX (Ri, Gi, Bi) determined by the comparing section 42, the white output value provided by the white output value calculating section 452 and the built-in preset percentage M provided by the gain value determining section 44. The red output value calculating section 453 calculates the red output value (i.e., R output value) according to the following expression 4.

$$Ro = M \times Ri \times Wo / MAX(Ri, Gi, Bi) + Ri - Wo \quad \text{[Expression 4]}$$

Where Ro represents the red output value.

The green output value calculating section 454 receives the linearized G value provided by the linearization section 41, the maximum value MAX (Ri, Gi, Bi) determined by the comparing section 42, the white output value provided by the white output value calculating section 452 and the built-in preset percentage M provided by the gain value determining section 44, and calculates out the green (G) output value according to the received linearized G value provided by the linearization section 41, the maximum value MAX (Ri, Gi, Bi) determined by the comparing section 42, the white output value provided by the white output value calculating section 452 and the built-in preset percentage M provided by the gain value determining section 44. The green output value calculating section 454 calculates the green output value (i.e., G output value) according to the following expression 5.

$$Go = M \times Gi \times Wo / MAX(Ri, Gi, Bi) + Gi - Wo \quad \text{[Expression 5]}$$

Where Go represents the green output value.

The blue output value calculating section 455 receives the linearized B value provided by the linearization section 41, the maximum value MAX (Ri, Gi, Bi) determined by the comparing section 42, the white output value provided by the white output value calculating section 452 and the built-in preset percentage M provided by the gain value determining section 44, and calculates out the blue (B) output value according to the received linearized B value provided by the linearization section 41, the maximum value MAX (Ri, Gi, Bi) determined by the comparing section 42, the white output value provided by the white output value calculating section 452 and the built-in preset percentage M provided by the gain value determining section 44. The blue output value calculating section 455 calculates the blue output value (i.e., B output value) according to the following expression 6.

$$Bo = M \times Bi \times Wo / MAX(Ri, Gi, Bi) + Bi - Wo \quad \text{[Expression 6]}$$

Where Bo represents the blue output value.

Figure 5:
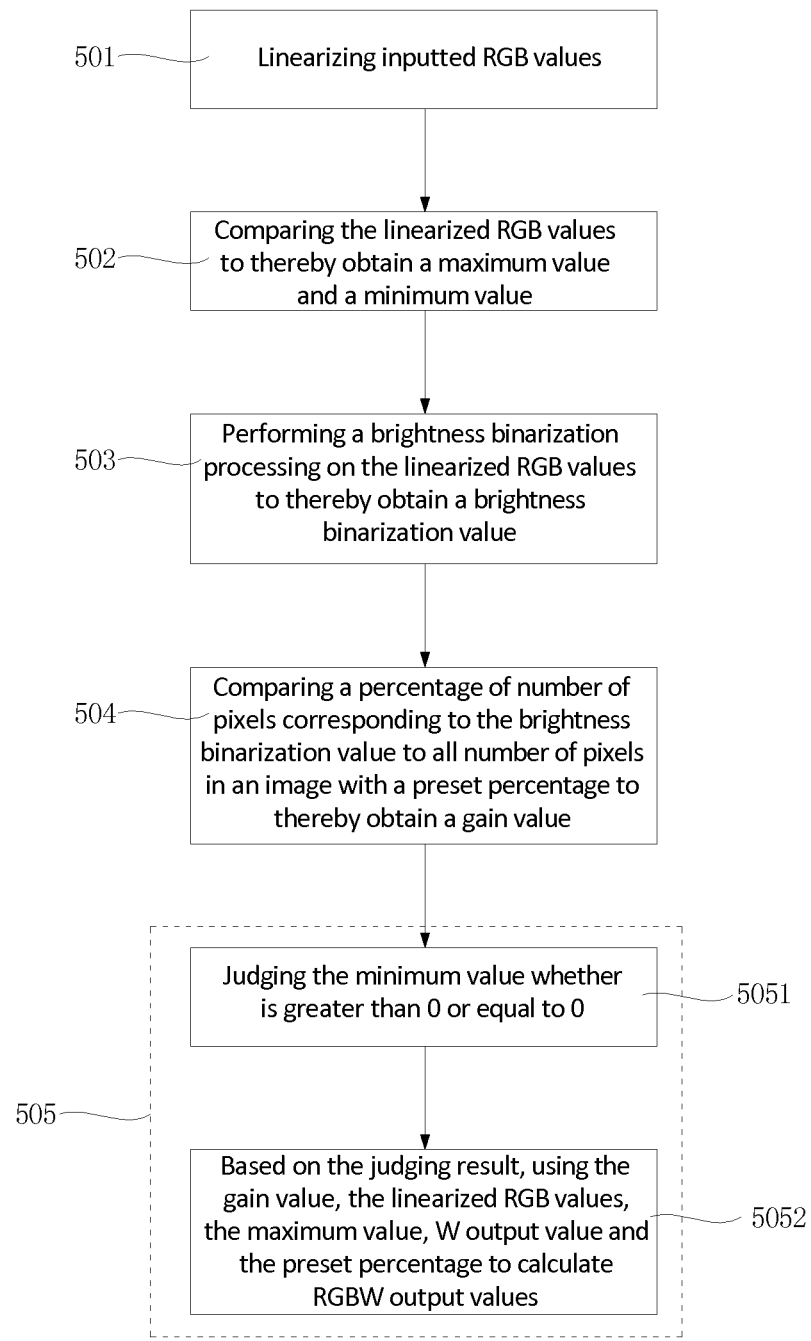
FIG. 5 is a flowchart of a RGB-to-RGBW color converting method according to an exemplary embodiment of the present invention.

FIG. 5 is a flowchart of a RGB-to-RGBW color converting method according to an exemplary embodiment of the present invention.

Referring to FIGS. 3 through 5, in an operation 501, the linearization section 41 linearizes inputted RGB values. Herein, the linearization section 41 linearizes inputted RGB values before the comparing section 42 determines a maximum value and a minimum value in the inputted RGB values. The linearization of the inputted RGB values can be expressed as a process of converting the inputted RGB values into values linearly proportional to an output brightness.

In an operation 502, the comparing section 42 compares the linearized RGB values with one another to determine the maximum value and the minimum value. The maximum value is a maximum value of the linearized RGB values and expressed as MAX (Ri, Gi, Bi), where Ri represents the linearized R value, Gi represents the linearized G value and Bi represents the linearized B value. The minimum value is a minimum value of the linearized RGB values and expressed as MIN (Ri, Gi, Bi).

In an operation 503, the binarization section 43 performs a brightness binarization processing on the linearized RGB values to thereby obtain a brightness linearization value Li. The binarization section 43 performs the brightness binarization processing on the linearized RGB values according to the above-mentioned expression 1.

In an operation 504, the gain value determining section 44 determines a percentage of number of pixels corresponding to the brightness binarization value Li in a brightness histogram, compares the percentage of the determined number of pixels corresponding to the brightness binarization value Li to all number of pixels in an image with a built-in preset percentage M, and thereby determines a gain value K. Herein, if the gain value determining section 44 determines that the percentage of the number of pixels corresponding to the brightness binarization value Li to the all number of pixels in the image is greater than the preset percentage M, the gain value determining section 44 determines the gain value K=1/M. If the gain value determining section 44 determines that the percentage of the number of pixels corresponding to the brightness binarization value Li to the all number of pixels in the image is not greater than the preset percentage M, the gain value determining section 44 determines the gain value K=M.

In an operation 505, the output value calculating section 45 calculates out RGBW output values according to the linearized RGB values, the maximum value MAX (Ri, Gi, Bi), the minimum value MIN (Ri, Gi, Bi), the gain value K and the preset percentage M. The RGBW output values includes red (R) output value, green (G) output value, blue (B) output value and white (W) output value.

In the above operations, the operation 502 and the operation 503 can be exchanged in the execution order, or the operation 502 and the operation 503 are simultaneously executed.

Furthermore, the RGBW output values can be calculated out by various ways described in operations 5051 and 5052.

In the operation 5051, the judging section 451 judges that minimum value MIN (Ri, Gi, Bi) whether is greater than 0 or equal to 0.

In the operation 5052, based on the judging result, using the gain value, the linearized RGB values, the maximum value, a white output value and the preset percentage to calculate the RGBW output values.

Herein, if the judging section 451 judges that the minimum value MIN (Ri, Gi, Bi) is greater than 0, the white output value calculating section 452 calculates out the white (W) output value according to the above-mentioned expression 2, the red output vale calculating section 453 calculates out the red (R) output value according to the above-mentioned expression 4, the green output value calculating section 454 calculates out the green (G) output value according to the above-mentioned expression 5, and the blue output value calculating section 455 calculates out the blue (B) output value according to the above-mentioned expression 6.

If the judging section 451 judges that the minimum value MIN (Ri, Gi, Bi) is equal to 0, the white output value calculating section 452 calculates out the white (W) output value according to the above-mentioned expression 3, the red output vale calculating section 453 calculates out the red (R) output value according to the above-mentioned expression 4, the green output value calculating section 454 calculates out the green (G) output value according to the above-mentioned expression 5, and the blue output value calculating section 455 calculates out the blue (B) output value according to the above-mentioned expression 6.

In summary, according to the various embodiments of the present invention, even if the white (W) sub-pixel unit is added, which still would not result in the decrease of red output value, the green output value and the blue output value, and therefore the color saturation can be improved while the whole brightness of image is maintained.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A RGB-to-RGBW color converting system comprising:
   a linearization section, configured to linearize inputted RGB values;
   a comparing section, configured to compare the linearized RGB values to thereby obtain a maximum value and a minimum value;
   a binarization section, configured to perform a brightness binarization processing on the linearized RGB values to thereby obtain a brightness binarization value;
   a gain value determining section, configured to compare a percentage of number of pixels corresponding to the brightness binarization value to all number of pixels in an image with a preset percentage to thereby obtain a gain value; and
   an output value calculating section, configured to calculate out RGBW output values according to the linearized RGB values, the maximum value, the minimum value, the gain value and the preset percentage, the RGBW output values being used for image display on a display panel.

2. The color converting system as claimed in claim 1, wherein if the gain value determining section judges that the percentage of the number of pixels corresponding to the brightness binarization value to the all number of pixels in the image is greater than the preset percentage, the gain value determining section obtains the gain value using the expression 1:

$$K=1/M,$$

where K represents the gain value, and M represents the preset percentage.

3. The color converting system as claimed in claim 1, wherein if the gain value determining section judges that the percentage of the number of pixels corresponding to the brightness binarization value to the all number of pixels in the image is not greater than the preset percentage, the gain value determining section obtains the gain value using the expression 2:

$$K=M,$$

where K represents the gain value, and M represents the preset percentage.

4. The color converting system as claimed in claim 1, wherein the output value calculating section comprises:
   a judging section, configured to judge the minimum value whether is greater than 0 or equal to 0;
   a white output value calculating section, configured to calculate out the W output value according to the judge result and the gain value;
   a red output value calculating section, configured to calculate out the R output value according to the linearized R value, the maximum value, the W output value and the preset percentage;
   a green output value calculating section, configured to calculate out the G output value according to the linearized G value, the maximum value, the W output value and the preset percentage; and
   a blue output value calculating section, configured to calculate out the B output value according to the linearized B value, the maximum value, the W output value and the preset percentage.

5. The color converting system as claimed in claim 4, wherein if the judging section judges that the minimum value is greater than 0, the white output value calculating section calculates out the W output value using the expression 3:

$Wo=K\times[MIN(Ri,Gi,Bi)]^2;$ the red output value calculating section calculates out the R output value using the expression 5:

$Ro=M\times Ri\times Wo/MAX(Ri,Gi,Bi)+Ri-Wo;$ the green output value calculating section calculates out the G output value using the expression 6:

$Go=M\times Gi\times Wo/MAX(Ri,Gi,Bi)+Gi-Wo;$ the blue output value calculating section calculates out the B output value using the expression 7:

$Bo=M\times Bi\times Wo/MAX(Ri,Gi,Bi)+Bi-Wo;$ where Wo represents the W output value, Ro represents the R output value, Go represents the G output value, Bo represents the B output value, Ri represents the linearized R value, Gi represents the linearized G value, the Bi represents the linearized B value, MAX (Ri, Gi, Bi) represents the maximum value, MIN (Ri, Gi, Bi) represents the minimum value, K represents the gain value, and M represents the preset percentage.

6. The color converting system as claimed in claim 4, wherein if the judging section judges that the minimum value is equal to 0, the white output value calculating section calculates out the W output value using the expression 4:

$Wo=0;$ the red output value calculating section calculates out the R output value using the expression 5:

$Ro=M\times Ri\times Wo/MAX(Ri,Gi,Bi)+Ri-Wo;$ the green output value calculating section calculates out the G output value using the expression 6:

$Go=M\times Gi\times Wo/MAX(Ri,Gi,Bi)+Gi-Wo;$ the blue output value calculating section calculates out the B output value using the expression 7:

$Bo=M\times Bi\times Wo/MAX(Ri,Gi,Bi)+Bi-Wo;$ where Wo represents the W output value, Ro represents the R output value, Go represents the G output value, Bo represents the B output value, Ri represents the linearized R value, Gi represents the linearized G value, the Bi represents the linearized B value, MAX (Ri, Gi, Bi) represents the maximum value, MIN (Ri, Gi, Bi) represents the minimum value, K represents the gain value, and M represents the preset percentage.

7. A RGB-to-RGBW color converting method comprising:
linearizing inputted RGB values;
comparing the linearized RGB values to thereby obtain a maximum value and a minimum value;
performing a brightness binarization processing on the linearized RGB values to thereby obtain a brightness binarization value;
comparing a percentage of number of pixels corresponding to the brightness binarization value to all number of pixels in an image with a preset percentage to thereby obtain a gain value; and
calculating out RGBW output values according to the linearized RGB values, the maximum value, the minimum value, the gain value and the preset percentage, the RGBW output values being used for image display on a display panel.

8. The color converting method as claimed in claim 7, wherein if the percentage of the number of pixels corresponding to the brightness binarization value to the all number of pixels in the image is greater than the preset percentage, obtaining the gain value using the expression 1:

$K=1/M,$

Where K represents the gain value, and M represents the preset percentage.

9. The color converting method as claimed in claim 7, wherein if the percentage of the number of pixels corresponding to the brightness binarization value to the all number of pixels in the image is not greater than the preset percentage, obtaining the gain value using the expression 2:

$K=M,$

Where K represents the gain value, and M represents the preset percentage.

10. The color converting method as claimed in claim 7, wherein the step of calculating out RGBW values comprises:
judging the minimum value whether is greater than 0 or equal to 0; and
based on the judging result, using the gain value, the linearized RGB values, the maximum value, the W output value and the preset percentage to calculate out the RGBW output values.

11. The color converting method as claimed in claim 10, if the minimum value is greater than 0, calculating out the RGBW output values using the following expression 3, expression 5, expression 6 and expression 7:

$Wo=K\times[MIN(Ri\,'Gi\,'Bi)]^2$  expression 3:

$Ro=M\times Ri\times Wo/MAX(Ri\,'Gi\,'Bi)+Ri-Wo$  expression 5:

$Go=M\times Gi\times Wo/MAX(Ri\,'Gi\,'Bi)+Gi-Wo$  expression 6:

$Bo=M\times Bi\times Wo/MAX(Ri\,'Gi\,'Bi)+Bi-Wo$  expression 7:

where Wo represents the W output value, Ro represents the R output value, Go represents the G output value, Bo represents the B output value, Ri represents the linearized R value, Gi represents the linearized G value, the Bi represents the linearized B value, MAX (Ri, Gi, Bi) represents the maximum value, MIN (Ri, Gi, Bi) represents the minimum value, K represents the gain value, and M represents the preset percentage.

12. The color converting method as claimed in claim 10, if the minimum value is equal to 0, calculating out the RGBW output values using the following expression 4, expression 5, expression 6 and expression 7:

$Wo=0$  expression 4:

$Ro=M\times Ri\times Wo/MAX(Ri\,'Gi\,'Bi)+Ri-Wo$  expression 5:

$Go=M\times Gi\times Wo/MAX(Ri\,'Gi\,'Bi)+Gi-Wo$  expression 6:

$Bo=M\times Bi\times Wo/MAX(Ri\,'Gi\,'Bi)+Bi-Wo$  expression 7:

where Wo represents the W output value, Ro represents the R output value, Go represents the G output value, Bo represents the B output value, Ri represents the linearized R value, Gi represents the linearized G value, the Bi represents the linearized B value, MAX (Ri, Gi, Bi) represents the maximum value, MIN (Ri, Gi, Bi) represents the minimum value, K represents the gain value, and M represents the preset percentage.

* * * * *